US010520569B2

United States Patent
Zeller (10) Patent No.: US 10,520,569 B2
(45) Date of Patent: Dec. 31, 2019

(54) METHOD AND MAGNETIC RESONANCE APPARATUS FOR OPTIMIZED SLICE MULTIPLEXING

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 278 days.

(21) Appl. No.: 15/720,561

(22) Filed: Sep. 29, 2017

(65) Prior Publication Data
US 2018/0095150 A1   Apr. 5, 2018

(30) Foreign Application Priority Data

Sep. 30, 2016   (DE) .................. 10 2016 218 955

(51) Int. Cl.
  *G01R 33/483*   (2006.01)
  *G01R 33/54*   (2006.01)

(52) U.S. Cl.
  CPC ....... *G01R 33/4835* (2013.01); *G01R 33/543* (2013.01)

(58) Field of Classification Search
  CPC .............. G01R 33/4835; G01R 33/543; G01R 33/446; G01R 33/483
  USPC ........................................................ 324/309
  See application file for complete search history.

(56) References Cited

U.S. PATENT DOCUMENTS

| 6,295,331 B1* | 9/2001 | Hsieh ............... G06T 11/005 378/19 |
| 2005/0033151 A1 | 2/2005 | Wu et al. |
| 2007/0036414 A1* | 2/2007 | Georgescu ........... G06T 7/12 382/128 |
| 2014/0111201 A1* | 4/2014 | Kim .................. G01R 33/543 324/309 |
| 2014/0247046 A1* | 9/2014 | Grinstead ......... G01R 33/4835 324/309 |
| 2015/0285879 A1 | 10/2015 | Hilbert et al. |
| 2015/0309142 A1* | 10/2015 | Li ................... G01R 33/5611 324/309 |

(Continued)

FOREIGN PATENT DOCUMENTS

DE   102014206395 A1   10/2015

OTHER PUBLICATIONS

German Office Action dated Jun. 20, 2018 for Application No. 10 2016 218 955.7 (including English-language translation).
(Continued)

*Primary Examiner* — Patrick Assouad
*Assistant Examiner* — Demetrius R Pretlow
(74) *Attorney, Agent, or Firm* — Schiff Hardin LLP (57) ABSTRACT

In a method and magnetic resonance (MR) apparatus for the optimized capture of MR measurement data of an object using at least two reception coils with slice multiplexing, achievable quality values for different parameter sets are tested in order to determine an optimum parameter set for the slice multiplexing. Slice multiplexing measurements thus can be performed with an optimum parameter set, so the capture time can be shortened and at the same time a higher quality is achieved in the measurement data that are generated and the images that are reconstructed.

10 Claims, 3 Drawing Sheets

(56) References Cited

U.S. PATENT DOCUMENTS

| | | | |
|---|---|---|---|
| 2015/0323634 A1* | 11/2015 | Polimeni | G01R 33/56509 |
| | | | 324/309 |
| 2015/0346300 A1* | 12/2015 | Setsompop | G01R 33/4828 |
| | | | 324/309 |
| 2015/0362574 A1 | 12/2015 | Wu et al. | |
| 2016/0170002 A1* | 6/2016 | Park | G01R 33/4835 |
| 2016/0231409 A1* | 8/2016 | Taviani | G01R 33/5611 |
| 2017/0038450 A1* | 2/2017 | Hoge | G01R 33/4835 |
| 2018/0011156 A1* | 1/2018 | Atalar | G01R 33/385 |
| 2018/0024215 A1* | 1/2018 | Zhu | G01R 33/4835 |
| | | | 324/309 |
| 2019/0113587 A1* | 4/2019 | Paulson | G01R 33/4808 |

OTHER PUBLICATIONS

Souza et al: "SIMA: Simultaneous Multislice Acquisition of MR Images by Hadamard-Encoded Excitation", Journal of Computer Assisted Tomography vol. 12, No. 6, pp. 1026-1030, (1988).

Setsompop et al., "Blipped-Controlled Aliasing in Parallel Imaging (blipped-CAIPI)for simultaneous multi-slice EPI with reduced g-factor penalty".: Magn Reson Med. , vol. 67, No. 5, pp. 1210-1224; (2012).

Cauley et. al.: "Interslice Leakage Artifact Reduction Technique for Simultaneous Multislice Acquisitions", Magnetic Resonance in Medicine,. vol. 72, pp. 93-102; (2014).

Robson et.al.: "Comprehensive Quantification of Signal-to-Noise Ratio and g-Factor for Image-Based and k-Space-Based Parallel Imaging Reconstructions", Magn Reson Med, vol. 60, No. 4, pp. 895-907; (2008).

Setsompop et.al.: "Improving diffusion MRI using simultaneous multi-slice echo planar imaging", NeuroImage, vol. 63, pp. 569-580; (2012).

Breuer et.al.: "Finding the optimal sampling pattern in 2D parallel imaging for a given receiver coil configuration", Proc. Intl. Soc. Mag. Reson. Med., vol. 13, p. 2665; (2005).

Breuer et al.: "The use of principal component analysis (PCA) for estimation of the maximum reduction factor in 2D parallel imaging", Proc. Intl. Soc. Mag. Reson. Med., vol. 13, p. 2668; (2005).

Breuer et. al.: "Controlled Aliasing in Parallel Imaging Results in Higher Acceleration (CAIPIRINHA) for Multi-Slice Imaging", Magnetic Resonance in Medicine, vol. 53, No. 3, pp. 684-691; (2005).

Larkman et al; "Use of Multicoil Arrays for Separation of Signal from Multiple Slices Simultaneously Excited", Journal of Magnetic Resonance Imaging; vol. 13; pp. 313-317; (2001).

* cited by examiner

METHOD AND MAGNETIC RESONANCE APPARATUS FOR OPTIMIZED SLICE MULTIPLEXING

BACKGROUND OF THE INVENTION

Field of the Invention

The invention concerns optimization of slice multiplexing methods in magnetic resonance technology.

Description of the Prior Art

Magnetic resonance (MR) technology is a known modality by which images of the interior of an object under examination can be generated. Simply described, the object under examination is positioned in a magnetic resonance scanner, in a strong, static, homogeneous constant magnetic field, also called the $B_0$ field, with field strengths of 0.2 tesla to 7 tesla and above, such that nuclear spins thereof are oriented in the direction of the constant magnetic field. In order to trigger nuclear spin resonance, radio-frequency excitation pulses (RF pulses) are radiated into the examination subject. The triggered nuclear spin resonances are measured as so-called k space data, and on the basis of this MR images are reconstructed or spectroscopic data are determined. For spatially encoding the measurement data, rapidly activated magnetic gradient fields are overlaid on the constant magnetic field. The recorded measurement data are digitalized and stored as complex numerical values in a k space matrix. An associated MR image can be reconstructed, for example by a multidimensional Fourier transform, from the k space matrix that is populated with such values.

The desire for ever faster MR data acquisition in the clinical environment is currently causing a resurgence in methods in which MR data for a number of images are captured simultaneously. In general, these methods can be characterized by the fact that, during at least a part of the measurement, transverse magnetization of at least two slices at the same time is utilized in a targeted manner for the imaging process ("multi-slice imaging" or "slice multiplexing"). In contrast to this, in the established "multiple slice imaging" technique, signals are respectively captured from at least two slices in alternation, completely independently of one another, with a correspondingly longer measurement time.

Known methods for this purpose are, for example, so-called Hadamard encoding, methods with simultaneous echo refocusing, methods with broadband data capture, and methods in which parallel imaging in the slice direction are used. The last-mentioned methods also include the CAIPIRINHA technique, as described by Breuer et al. in "Controlled Aliasing in Parallel Imaging Results in Higher Acceleration (CAIPIRINHA) for Multi-Slice Imaging", *Magnetic Resonance in Medicine* 53, 2005, pp. 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", *Magnetic Resonance in Medicine* 67, 2012, pp. 1210-1224.

In slice multiplexing methods of this kind, a multi-band RF pulse is used to simultaneously excite two or more slices, or to manipulate them in another way, for example by refocusing or saturation. A multi-band RF pulse of this kind can be a multiplex of individual RF pulses used for manipulating the individual slices that are to be manipulated simultaneously. The multiplexing gives produces a multi-band RF pulse with modulated base band, by summating the pulse shapes of the individual RF pulses.

In order to allow the resulting signals of the different slices to be separated, before multiplexing the individual RF pulses are each given a different phase, for example by adding a linear phase increase, as a result of which the slices are offset from one another in space. This offset is controlled by the field of view (FOV) shift factor.

Figure 2:
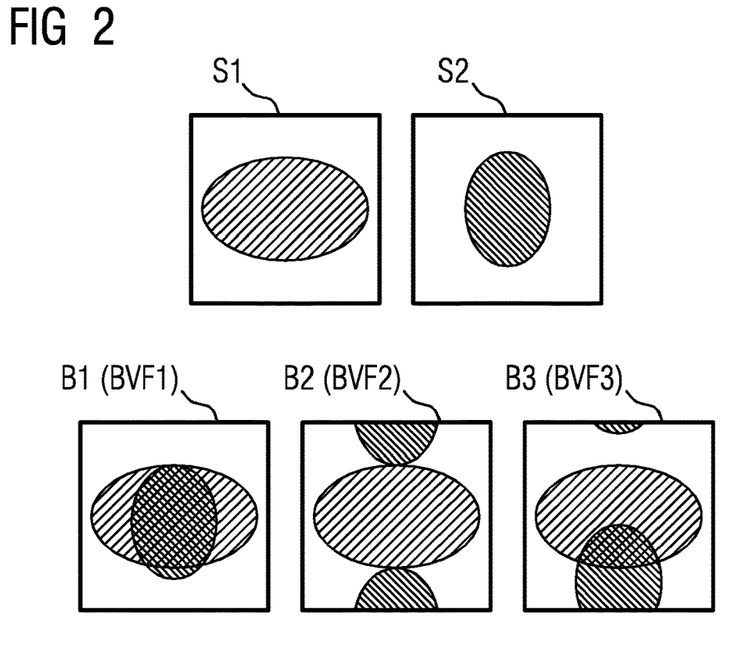
FIG. 2 shows schematic examples of effects of different FOV shift factors.

FIG. 2 shows, as an example, the effect of three different FOV shift factors BVF1, BBVF2 and BVF3 when two slices S1 and S2 are captured simultaneously. In the upper row of FIG. 2, the information contained in the slices S1 and S2 is shown schematically. With a field of view shift factor BVF1 of 1, as shown in the second row of FIG. 2, in a collapsed image B1(BVF1) that is reconstructed from the signals measured simultaneously for the slices S1 and S2, the sets of information from the two slices S1 and S2 are not offset from one another. With a field of view shift factor BVF2 of 2, however, in a collapsed image B2(BVF2) that is reconstructed from the signals measured simultaneously for the slices S1 and S2, the sets of information from the two slices S1 and S2 are offset from one another by half the full field of view (FOV). With a field of view shift factor BVF3 of 3, by contrast, in a collapsed image B3(BVF3) that is reconstructed from the signals measured simultaneously for the slices S1 and S2, the sets of information from the two slices S1 and S2 are offset from one another by one third of the full field of view (FOV).

As described in the above-mentioned article by Setsompop et al., sacrifices in quality, resulting from the slice multiplexing methods used, in the measurement data obtained that are determined by the so-called geometry factor ("g factor") can be reduced by offsets between the slices, for example by using gradient blips or by modulating the phases of the individual RF pulses appropriately.

As likewise described in the aforementioned article by Setsompop et al. as well as in the aforementioned article by Breuer et al., the signals of the slices that are simultaneously excited or otherwise manipulated may first be grouped together in the manner of signals from only one slice in order then, in a subsequent processing step, to be separated by a parallel reconstruction method, such as a (slice) GRAPPA method (GRAPPA stands for "GeneRalized Autocalibrating Partial Parallel Acquisition") or a SENSE method (SENSE stands for "sensitivity encoding").

Techniques for quantifying the quality of results from slice multiplexing methods are described for example in the article by Robson et al., "Comprehensive Quantification of Signal-to-Noise Ratio and g-Factor for Image-Based and k-Space-Based Parallel Imaging Reconstructions", *Magnetic Resonance in Medicine* 60: pp. 895-907, 2008.

In slice multiplexing methods, the quality of the results obtained is also affected by the parameters selected, such as the field of view shift factor as described above, the spacing between slices that are to be detected simultaneously, the size of the slice-separation kernels that are used to separate the slices, and the number of slices to be detected simultaneously (SMS factor), which determines the extent to which the overall measurement is speeded up by comparison with a conventional, single-slice measurement.

SUMMARY OF THE INVENTION

An object of the present invention is to optimize the selection of the parameters used in the context of a slice multiplexing method in order to enable optimum results of the slice multiplexing method.

A method according to the invention for the optimized capture of MR measurement data of an object under examination using at least two reception coils of an MR data acquisition scanner operated by a computer with slice multiplexing, in which magnetic resonance (MR) signals from at least two different slices of the object under examination are detected simultaneously when the MR signals are captured, has the following steps:

a) loading a reference data set into the computer that includes all the slices to be measured, b) selecting, in the computer, a first parameter set for the slice multiplexing method, c) determining, in the computer, a set of slice-separation kernels on the basis of the reference data set and the selected parameter set, d) determining, in the computer, a quality value of a reconstruction of single slice data that can be performed using the determined set of slice-separation kernels and the selected parameter set, e) selecting, in the computer, a further parameter set that differs from the first parameter set in respect of at least one parameter, f) repeating steps c) and d) with the further parameter set, g) repeating steps e) and f) with further parameter sets that differ from the previously selected parameter sets in respect of at least one parameter until an optimum parameter set with which a desired quality value has been obtained is identified, and h) capturing measurement data of the object under examination with the slice multiplexing using the optimum parameter set.

The acquired MR measurement data are made available from the computer in electronic form, as a data file.

According to the invention, achievable quality values for different parameter sets are thus tested in order to determine an optimum parameter set by which slice multiplexing can be used for measuring measurement data of the object under examination. According to the invention, slice multiplexing measurements are performed with an optimum parameter set, as a result of which the capture time can be further shortened and at the same time a higher quality is achieved in the measurement data that are generated and the images that are reconstructed.

A magnetic resonance apparatus according to the invention includes a data acquisition scanner with a basic field magnet, a gradient coil arrangement, a radio-frequency (RF) antenna, and a control computer that is designed (programmed) to perform the method according to the invention, with a radio-frequency send/receive controller with an optimization processor.

The present invention also encompasses a non-transitory, computer-readable data storage medium encoded with programming instructions (program code) that, when the storage medium is loaded into a computer or computer system of a magnetic resonance apparatus, cause the computer or computer system to operate the magnetic resonance apparatus in order to implement any or all embodiments of the method according to the invention, as described above.

The advantages and embodiments that are described with regard to the method apply as well to the magnetic resonance apparatus and the electronically readable data storage medium.

DESCRIPTION OF THE PREFERRED EMBODIMENTS

Figure 1:
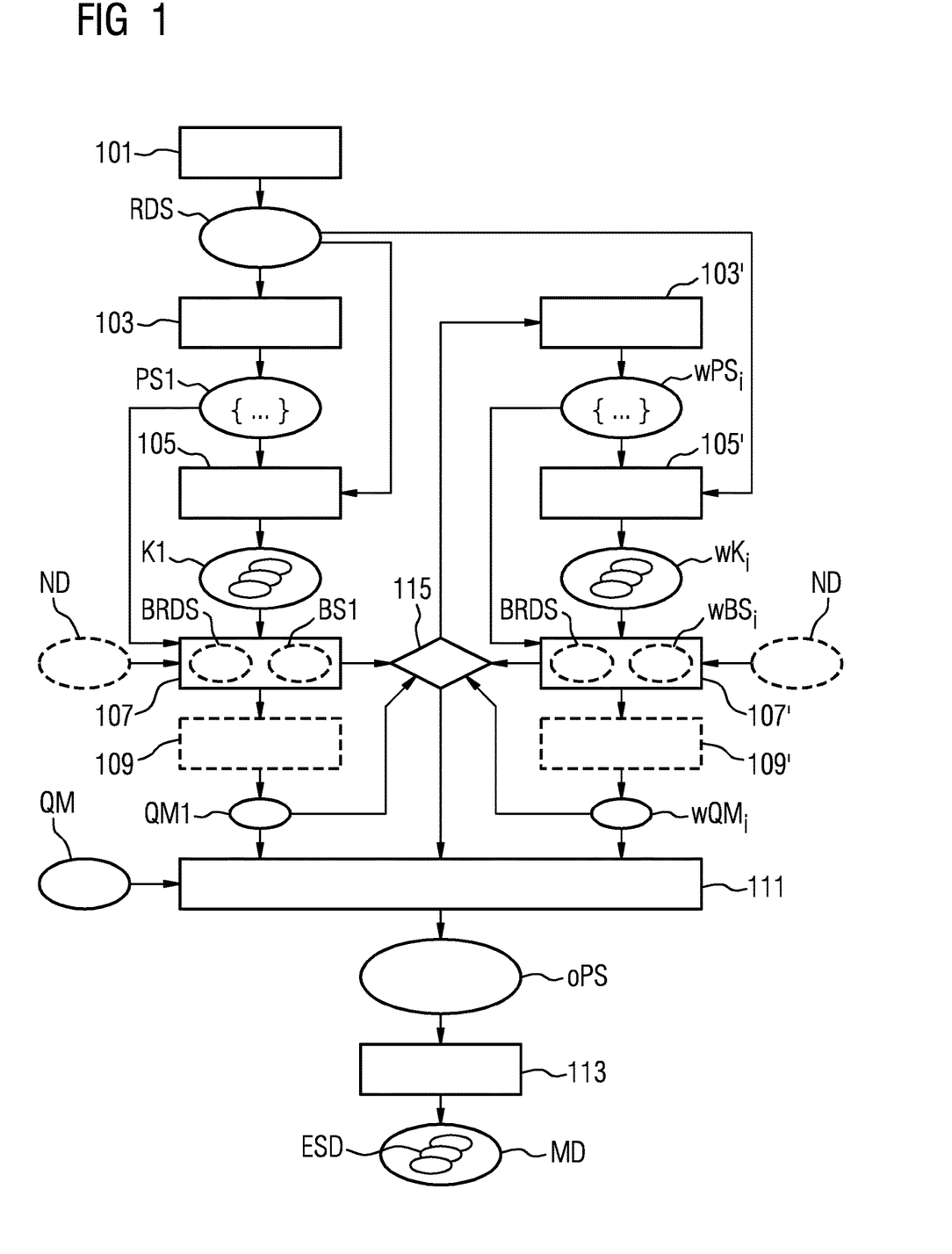
FIG. 1 is a flowchart of the method according to the invention.

FIG. 1 is a flowchart of the method according to the invention for the optimized capture of measurement data of an object under examination by means of at least two reception coils with the use of slice multiplexing, in which magnetic resonance (MR) signals from at least two difference slices of the object under examination are detected simultaneously as the MR signals are captured.

A reference data set RDS is loaded into a computer that will operate an MR data acquisition scanner in order to acquire MR data (block 101). The reference data set RDS includes reference data for the slices that are to be measured in a desired capture of measurement data with the aid of a slice multiplexing method. The reference data set RDS is suitable for calibrating slice-separation kernels of a slice multiplexing method. Here, the loaded reference data set RDS may be a reference data set that is captured by a conventional single-slice method from the object under examination that is to be measured using the slice multiplexing method, or a reference data set that is generated from a stored data set or an artificial data set.

If the reference data set RDS is captured directly at the object under examination at which measurement data are subsequently to be captured using the slice multiplexing method, then the reference data set RDS is matched to the object under examination as closely as possible. A reference data set RDS of this kind may be stored as a stored data set for later (re-)use.

However, it is also possible to use a stored data set that includes reference data sets that were measured in previous measurements. The reference data sets included in such a stored data set may have been captured from different objects under examination with different measurement objectives (resolution, field of view, etc.).

If the reference data set RDS is loaded from a stored data set, then the reference data set RDS selected from the reference data sets in the stored data set is that corresponding most closely to the desired slice multiplexing measurement. The degree of correspondence may in this case be determined on the basis of the reception coils to be used, on the basis of an object under examination to be measured in the slice multiplexing measurement, e.g. a body region of a patient, and/or on the basis of the desired resolution, number of slices, etc. It is also possible for the geometry of an object under examination from which measurement data is to be captured using the slice multiplexing method to be determined initially with the aid of a localization measurement, and for the reference data set that corresponds most closely to the determined geometry of the object under examination to be selected.

It is also possible for the reference data set RDS to be generated from an artificial data set. Here in particular, simulated data may be used. The simulated data of the artificial data set may itself be generated on the basis of the desired capture of measurement data using the slice multiplexing method, in particular the desired resolution, field of view, etc.

If the reference data set RDS is not obtained from the object currently under examination but from existing data (a stored data set or artificial data set), then the identification according to the invention of an optimum parameter set oPS for capture of measurement data of the current object under examination using the slice multiplexing method, and the processing steps to be performed during this slice multiplexing, may in principle take place independently of the subsequent capture of measurement data of the object under examination using the slice multiplexing method. For example, for particular measurement objectives (such as field of view, resolution, region of interest of the object under examination) of the capture of measurement data of an object under examination using the slice multiplexing method, it is possible for optimum parameter sets oPS already to be stored in a parameter set stored memory and to be selected as needed. This selection can be made, for example, on the basis of the closest possible agreement of the reception coils that form the basis of the reference data set and are to be used with the desired measurement (number, type) of the underlying region under examination, such as a body region of a patient, etc. that is to be measured.

A first parameter set PS1 for the slice multiplexing method to be performed is selected (block 103). The first parameter set PS1 may in particular include as a parameter a field of view shift factor, a distance between slices, a size of the slice-separation kernels and/or a number of slices that are to be detected simultaneously.

On the basis of the reference data set RDS and the first parameter set PS1, an associated first set of slice-separation kernels K1 is determined (block 105). Here, in accordance with the parameters in the first parameter set PS1, a phase to be used and hence a field of view shift factor are for example taken into account, the latter being applied for example to collapsed multiple slice data sets that are constructed from the reference data set in a manner corresponding to the slices to be detected simultaneously by the first parameter set PS1. Determining the set of slice-separation kernels K1 in this way is known in principle and may for example be carried out as in the article by Breuer et al. or the article by Setsompop et al.

On the basis of the determined set of slice-separation kernels K1 and the selected parameter set PS1, a quality value QM1 is determined that represents the quality of a reconstruction of single slice data that could be performed using the determined set of slice-separation kernels K1 and the selected parameter set PS1 (box 107). A quality value QM1 of this kind may for example be determined in a manner described in the above-mentioned article by Robson et al.

The determined quality values thus can represent signal-to-noise ratios and/or geometry factors achieved with the slice multiplexing reconstruction, in particular in each case with spatial resolution.

However, a possible quality value of this kind may be an assessment of possible aliasing artifacts. For this purpose, image data reconstructed from the reference data set are compared with image data that are reconstructed from the reconstructed single-slice data, and a threshold value is predetermined for a maximum deviation of the compared image data from one another. If the deviation of this kind is small, it may be assumed that there are few artifacts in image data reconstructed from the reconstructed single-slice data.

For example, in order to keep the processing capacity required for determining the quality values QM1 low, determining the quality value QM1 may include an artificial reduction of the spatial resolution of the data used (block 109). Here, the resolution of the reference data set RDS may for example be reduced to a coarser raster before the quality value is determined using this coarser raster.

Determining the quality value QM1 (block 107) may include determining noise values ND. Noise values ND of this kind may in particular be identified by measuring pure noise on the reception coils that are used.

In decision block 115, a check is made as to whether further parameter sets should be tested. If only the first parameter set PS1 has been used up to this point, a further parameter set $wPS_i$, which differs from the first parameter set PS1 in respect of at least one parameter, is selected for the slice multiplexing method to be performed (box 103'), where i is a counter of the further parameter sets and a natural number greater than or equal to one ($i \geq 1$). The further parameter set $wPS_i$ may once again include as a parameter in particular a field of view shift factor, a spacing between slices, a size of the slice-separation kernels and/or a number of slices to be detected simultaneously.

In a selected parameter set PS1, $wPS_i$ it is possible for at least one parameter to be established globally, meaning that, in a selected parameter set, at least one parameter may be established to be the same for all the contained slices or groups of slices that are to be detected simultaneously. For example, for all the groups of slices that are to be detected simultaneously, only one FOV shift factor and/or only one number of slices to be detected simultaneously and/or only one spacing between slices may be established in a selected parameter set PS1, $wPS_i$.

A globally established spacing between slices may be advantageous in order to avoid more easily saturation effects caused by manipulations of the spins in neighboring slices.

However, it is also possible, in a selected parameter set PS1, $wPS_i$, for at least one parameter to be established only locally, that is to say in a selected parameter set a locally established parameter may differ for example regionally and/or for different groups of slices that are to be detected simultaneously. For example, for each group of slices that are to be detected simultaneously, an individual spacing between slices and/or an individual number of slices to be detected simultaneously and/or an individual FOV shift factor may in each case be established as a parameter only locally. Establishing parameters locally improves the degree of freedom of the different parameter sets PS1, $wPS_i$ that are selected and hence the number of different parameter sets that may be selected.

The FOV shift factor parameter is particularly useful for being established locally, that is to say in a manner different for different groups of slices to be detected simultaneously, because the FOV shift factor only affects the result of reconstruction of the respective group of slices to be detected simultaneously.

Parameter sets PS1, $wPS_i$ that are chosen in this manner may include as a parameter a number of slices to be detected simultaneously, and the number of slices to be detected simultaneously may be varied in certain regions as a function of quality values that are established. This may be done for example in that in regions in which there is a high signal-to-noise ratio (SNR) and/or a small geometry factor, a higher number of slices to be detected simultaneously is established as a parameter locally than in regions in which there is a low SNR and/or a high geometry factor.

If the size of the slice-separation kernels is included as a parameter in the selected parameter sets PS1, $wPS_i$, this parameter may likewise be established either globally or locally. A 3×3 matrix is frequently established as the size of the slice-separation kernels. However, in particular if there is only a small SNR and/or only a small spatial change in the sensitivities of the reception coils that are used, larger slice-separation kernels, for example 5×3, 5×5 or indeed 7×3 slice-separation kernels or larger, typically enable better quality in the reconstruction of the single slices in the context of the slice multiplexing method. For this reason, for example as a function of a spatial SNR distribution and/or the spatial distribution of the sensitivity of the reception coils used, the size of the slice-separation kernels can be established so as to differ locally.

On the basis of the reference data set RDS and the current further parameter set $wPS_i$, an associated further set of slice-separation kernels $wK_i$ is determined (block 105'). Here, the procedure followed is based on the reference data set RDS and the first parameter set PS1, in a manner similar to that for determining the first parameter set PS1.

A quality value $wQMi$, associated with the selected parameter set $wPS_i$, of a reconstruction of single slice data that may be performed using the determined set of slice-separation kernels $wK_i$ and the selected parameter set $wPS_i$ is determined (block 107' or block 109'), wherein again the procedure followed is similar to that for determining the quality value QM1 associated with the first parameter set PS1.

Thus, the steps for determining a set of slice-separation kernels $wK_i$ that is associated with a selected parameter set $wPS_i$ (block 105') and determining a quality value $wQM_i$ that is associated with a selected parameter set wPSi (block 107' or block 109') is repeated with further parameter sets $wPS_i$.

Again, in decision block 115 a check is made as to whether further parameter sets are to be tested. Here, it can be decided as to whether all the desired or possible parameter sets PS1 and $wPS_i$ have already been selected (103, 103') and tested (107, 107') and/or whether a particular quality value QM1, $wQM_i$ corresponds to at least one predetermined desired minimum value. If this is not the case, a further parameter set, which again differs from already tested parameter sets with respect to at least one parameter, is once more selected (block 103') and an associated set of slice-separation kernels (block 105') and an associated quality value $wQM_i$ (block 107') are determined before the decision block 115 is again performed. In this way, the steps represented by blocks 103' to 107' are repeated until an optimum parameter set oPS by means of which a desired quality value has been obtained is identified.

If it is established in decision block 115 that all the desired or possible parameter sets PS1 and $wPS_i$ have already been selected (103, 103') and tested (107, 107') and/or a determined quality value QM1, $wQM_i$ corresponds at least to a predetermined desired minimum value QM, then the best of the determined quality values QM1, $wQM_i$ can be determined and the associated parameter set (PS1, $wPS_i$) can be identified as the optimum parameter set oPS (block 111).

Using the identified optimum parameter set oPS, it is now possible to capture simultaneously measurement data MD of individual slices of the object under examination with the aid of the slice multiplexing method and to separate it into data from single slices ESD (block 113).

Figure 3:
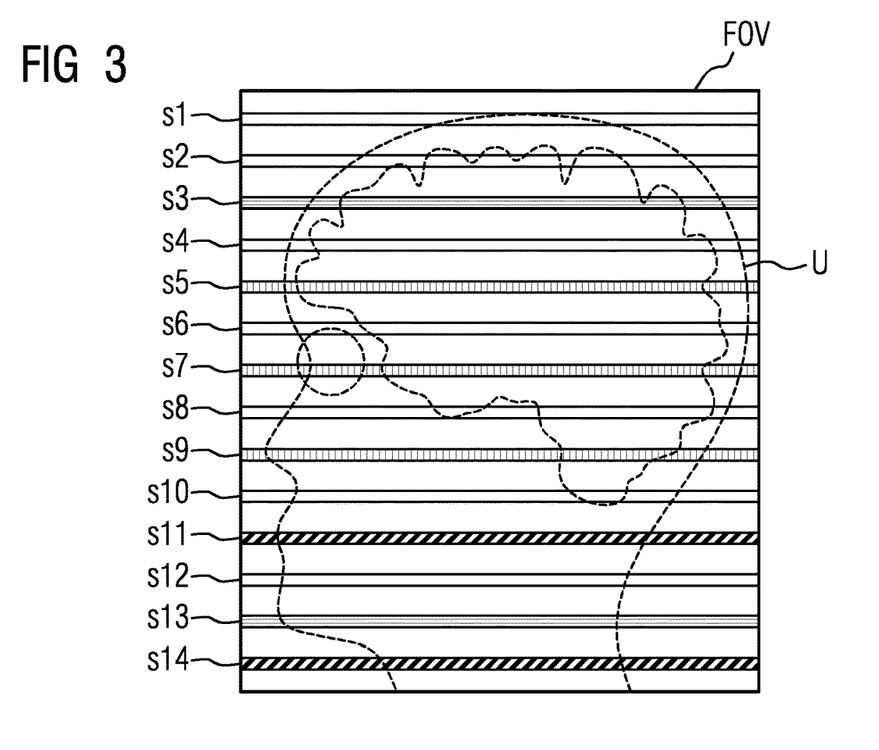
FIG. 3 shows a schematic example of part of an optimization result of the method according to the invention.

FIG. 3 is a schematic example of part of a possible optimization result of the method according to the invention. Here, there is represented schematically a head as the object under examination U, which is to be measured in a field of view FOV in, by way of example, fourteen slices s1 to s14. Three slice groups that are each to be detected simultaneously as the result of optimization are each differentiated in FIG. 3 by a different style of hatching, namely s3-s13, s11-s14 and s5-s7-s9. The slice group s3-s13 to be detected simultaneously comprises two slices, in this case with a slice spacing of ten slices. The slice group s11-s14 to be detected simultaneously likewise comprises two slices but has a slice spacing of three slices. The last slice group illustrated s5-s7-s9 comprises three slices with a slice spacing of two slices. As well as the number of slices to be detected simultaneously and the slice spacing thereof, further parameters may also be varied from one slice group to the next, as the result of optimization. For example, the slice groups s3-s13 and s5-s7-s9 may have a field of view shift factor of 3 but the slice group s11-s14 may have a field of view shift factor of 2. The size of the respective slice-separation kernels may also turn out differently as a result of the optimization for each slice group. After the optimization, all the slices to be captured of a slice group to be determined simultaneously are associated with their own parameters in each case.

Figure 4:
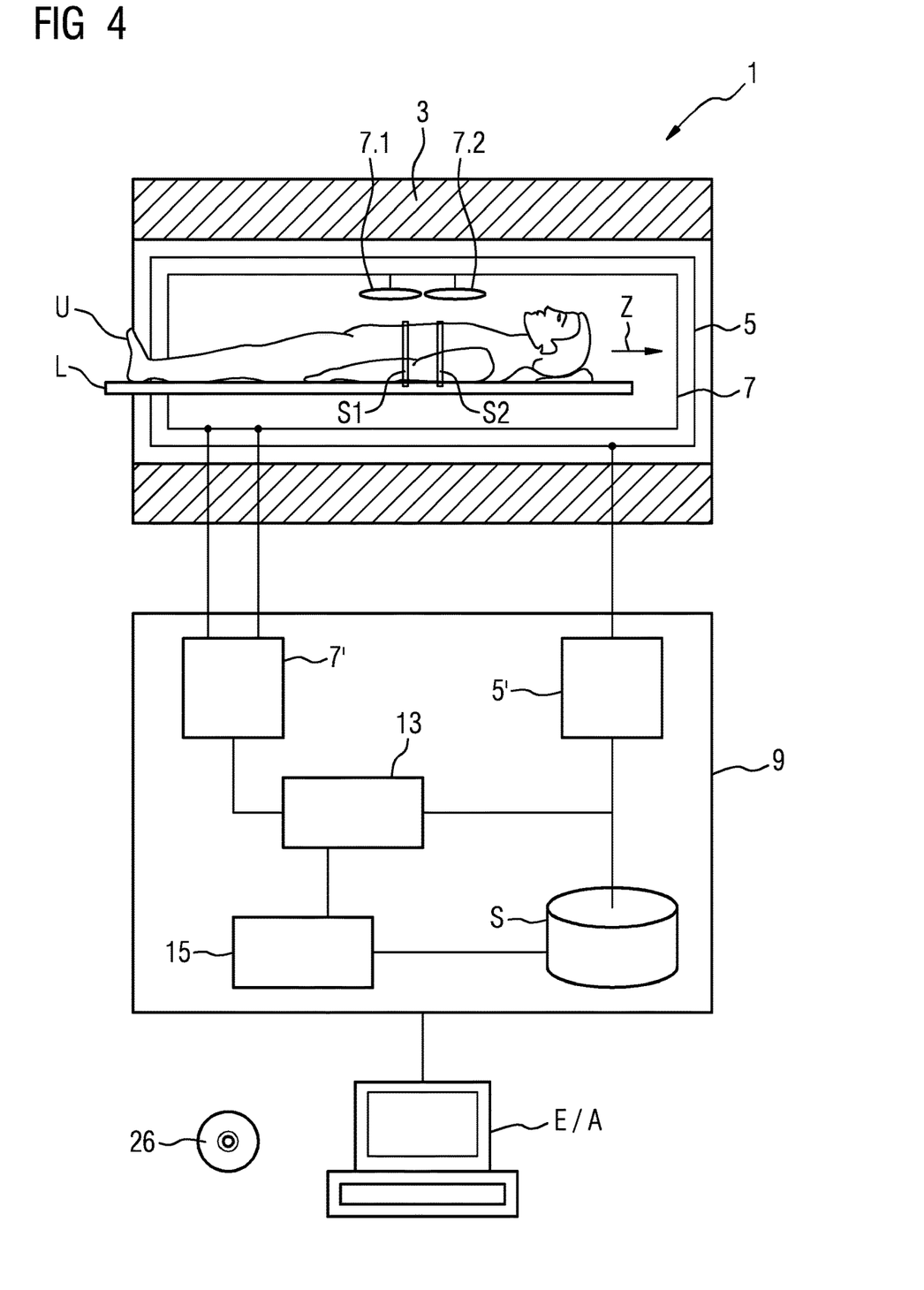
FIG. 4 schematically illustrates a magnetic resonance apparatus according to the invention.

FIG. 4 schematically illustrates a magnetic resonance apparatus according to the invention. This includes scanner 1 with a basic field magnet 3 that generates a constant basic magnetic field, a gradient coil arrangement 5 that generates gradient fields, a radio-frequency (RF) antenna 7 that radiates and receives radio-frequency signals, and a control computer 9 configured to perform the method according to the invention. In FIG. 4, these sub-units of the magnetic resonance apparatus are illustrated only schematically. The radio-frequency antenna 7 may be formed by at least two coils such as the schematically shown coils 7.1 and 7.2, which may be designed only to radiate radio-frequency signals, or only to receive the triggered radio-frequency MR signals, or to do both.

For investigating an object U under examination, for example a patient or a phantom, the object U is introduced into the measurement volume of the scanner 1 while lying on a bed L. The slices S1 and S2 represent, as an example, two different slices S1 and S2 of the object under examination that may be detected simultaneously during the capture of MR signals.

The control computer 9 serves to control the magnetic resonance apparatus and controls the gradient coil arrangement 5 via a gradient controller 5' and the radio-frequency antenna 7 via a radio-frequency send/receive controller 7'. The radio-frequency antenna 7 may include a number of channels via which signals may be individually sent or received.

The radio-frequency antenna 7, together with its radio-frequency send/receive controller 7', generates and radiates (emits) a radio-frequency alternating field for manipulating nuclear spins in a region to be manipulated (in particular to give different slices S1 and S2) of the object U. The center frequency of the radio-frequency alternating field, also called the $B_1$ field, must lie close to the resonant frequency of the spins to be manipulated. To generate the $B_1$ field, currents controlled in the radio-frequency antenna 7 by the radio-frequency send/receive controller 7' are supplied to the RF coils.

Furthermore, the control computer 9 has an optimization processor 15, for loading reference data sets and for determining quality values, in order to perform the method according to the invention for the optimized capture of measurement data of the object U, using at least two reception coils with slice multiplexing, in which magnetic resonance (MR) signals from at least two different slices S1 and S2 of the object under examination are detected simultaneously during capture of the MR signals.

An arithmetic unit 13 of the control computer 9 performs all the processing operations required for the required measurements and determinations. For this purpose, results and intermediate results that are required or determined during this may be stored in a memory S of the control computer 9. The units that are illustrated herein are not necessarily physically separated units, but merely represent a subdivision into functional units, which may take the form of fewer units, or only one physical unit.

Control commands are entered into the magnetic resonance apparatus via an input/output interface E/A, for example by a user, and/or results such as image data of the control computer 9 may be displayed at the input/output interface E/A.

An electronically readable data storage medium 26 (i.e., a non-transitory data storage medium) is encoded with programming instructions (program code) that, when the storage medium 26 is loaded into the control computer 9, cause the control computer 9 to operate the magnetic resonance apparatus, in particular the scanner 1 thereof, in order to implement the method according to the invention, as described above.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) measurement data from an object using at least two reception coils of an MR data acquisition scanner with slice multiplexing, in which MR signals from at least two different slices of the object are detected simultaneously with said at least two reception coils, said method comprising:
   (a) loading a reference data set into a computer that includes all slices of the object from which MR data are to be acquired;
   (b) in said computer, selecting a first parameter set for said slice multiplexing;
   (c) in said computer, determining a set of slice-separation kernels from said reference data set and said selected parameter set;
   (d) in said computer, determining a quality value of a reconstruction of single slice data that can be performed using the determined set of slice-separation kernels and the selected parameter set;
   (e) in said computer, selecting a further parameter set, which differs with regard to at least one parameter from said first parameter set;
   (f) in said computer, repeating (c) and (d) with said further parameter set in place of said selected parameter set;
   (g) in said computer, repeating (e) and (f) with further parameter sets, which differ from the parameter sets selected in (b) and (e) with regard to at least one parameter, until an optimum parameter set that has said quality value is obtained; and
   (h) operating said MR data acquisition scanner, while the object is situated therein, in order to acquire said MR measurement data with said slice multiplexing using said optimum parameter set, and thereby obtaining a data file of said MR data, and making said data file of said MR data available from said computer in electronic form.

2. A method as claimed in claim 1 wherein said MR measurement data are to be acquired with a spatial resolution, and comprising, in (d), determining said quality value with an artificial reduction of said spatial resolution.

3. A method as claimed in claim 1 wherein each of said parameter sets comprises at least one parameter selected from the group consisting of a field of view shift factor, a spacing between said slices, a size of said slice-separation kernels, and a number of said slices to be detected simultaneously.

4. A method as claimed in claim 1 comprising, in said computer, establishing at least one parameter of said parameter sets globally.

5. A method as claimed in claim 1 comprising, in said computer, establishing at least one parameter of said parameter sets locally.

6. A method as claimed in claim 1 wherein each of said parameter sets comprises a parameter designating a number of said slices to be detected simultaneously, and varying said number of slices to be detected simultaneously in selected regions of said object dependent on respective quality values that are used in the repetitions in (g).

7. A method as claimed in claim 1 comprising determining said quality value so as to achieve at least one of a predetermined signal-to-noise ratio or a geometry factor.

8. A method as claimed in claim 1 comprising, in (a), loading said reference data set as a reference data set acquired from said object, or a reference data set generated from a stored data set, or an artificial data set.

9. A magnetic resonance (MR) apparatus comprising:
   an MR data acquisition scanner operable to acquire MR measurement data from an object using at least two reception coils of the MR data acquisition scanner with slice multiplexing, in which said MR signals from at least two different slices of the object are detected simultaneously with said at least two reception coils;
   a computer loaded with a reference data set that includes all slices of the object from which MR data are to be acquired;
   said computer being configured to select a first parameter set for said slice multiplexing;
   said computer being configured to determine a set of slice-separation kernels from said reference data set and said selected parameter set;
   said computer being configured to determine a quality value of a reconstruction of single slice data that can be performed using the determined set of slice-separation kernels and the selected parameter set;
   said computer being configured to select a further parameter set, which differs with regard to at least one parameter from said first parameter set;
   said computer being configured to repeat determining the set of slice-separation kernels and determining said quality value, each with said further parameter set in place of said selected parameter set;
   said computer being configured to repeat selecting said further parameter set and the repeating of determining the set of slice-separation kernels and determining said quality value, each with further parameter sets, which differ from the selected parameter set with regard to at least one parameter, until an optimum parameter set that has said quality value is obtained; and
   said computer being configured to operate said MR data acquisition scanner, while the object is situated therein, in order to acquire said MR measurement data with said slice multiplexing using said optimum parameter set, and thereby obtain a data file of said MR data, and to make said data file of said MR data available from said computer in electronic form.

10. A non-transitory, computer-readable data storage medium encoded with programming instructions for acquiring magnetic resonance (MR) measurement data from an object using at least two reception coils of an MR data acquisition scanner with slice multiplexing, in which MR signals from at least two different slices of the object are detected simultaneously with said at least two reception coils, said storage medium being loaded into a computer of said MR data acquisition scanner and said programming instructions causing said computer to:

(a) receive a reference data set that includes all slices of the object from which MR data are to be acquired;
(b) select a first parameter set for said slice multiplexing;
(c) determine a set of slice-separation kernels from said reference data set and said selected parameter set;
(d) determine a quality value of a reconstruction of single slice data that can be performed using the determined set of slice-separation kernels and the selected parameter set;
(e) select a further parameter set, which differs with regard to at least one parameter from said first parameter set;
(f) repeat (c) and (d) with said further parameter set in place of said selected parameter set;
(g) repeat (e) and (f) with further parameter sets, which differ from the parameter sets selected in (b) and (e) with regard to at least one parameter, until an optimum parameter set that has said quality value is obtained; and
(h) operate said MR data acquisition scanner, while the object is situated therein, in order to acquire said MR measurement data with said slice multiplexing using said optimum parameter set, and thereby obtain a data file of said MR data, and make said data file of said MR data available from said computer in electronic form.

* * * * *